United States Patent
Anderson et al.

(10) Patent No.: US 10,217,685 B2
(45) Date of Patent: Feb. 26, 2019

(54) AIR-CAVITY PACKAGE WITH DUAL SIGNAL-TRANSITION SIDES

(71) Applicant: Qorvo US, Inc., Greensboro, NC (US)

(72) Inventors: Kevin J. Anderson, Plano, TX (US); Ning Chen, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/914,448

(22) Filed: Mar. 7, 2018

(65) Prior Publication Data

US 2018/0197800 A1 Jul. 12, 2018

Related U.S. Application Data

(62) Division of application No. 15/410,151, filed on Jan. 19, 2017, now Pat. No. 9,935,026.

(Continued)

(51) Int. Cl.
*H01L 21/50* (2006.01)
*H01L 23/10* (2006.01)
(Continued)

(52) U.S. Cl.
CPC .............. *H01L 23/10* (2013.01); *H01L 21/50* (2013.01); *H01L 23/04* (2013.01); *H01L 23/3675* (2013.01); *H01L 23/49822* (2013.01); *H01L 23/49827* (2013.01); *H01L 23/49838* (2013.01); *H01L 23/66* (2013.01); *H01L 24/48* (2013.01); *H01L 25/0652* (2013.01); *H01L 25/105* (2013.01); *H01L 25/50* (2013.01); *H01L 21/563* (2013.01); *H01L 23/49833* (2013.01);
(Continued)

(58) Field of Classification Search
None
See application file for complete search history.

(56) References Cited

U.S. PATENT DOCUMENTS 7,419,852 B2 * 9/2008 Benson ............. H01L 21/76898
438/108
8,426,953 B2 * 4/2013 Liu ..................... H01L 23/3107
438/123

(Continued)

OTHER PUBLICATIONS

Author Unknown, "Subtron," Subtron Technology Co., Ltd, 2012, 2 pages, http://www.subtron.com.tw/.
(Continued)

*Primary Examiner* — Chandra Chaudhari
(74) *Attorney, Agent, or Firm* — Withrow & Terranova, P.L.L.C.

(57) ABSTRACT

The present disclosure relates to an air-cavity package, which includes a bottom substrate, a top substrate, a perimeter wall, a bottom electronic component, and a top electronic component. The bottom substrate includes a bottom signal via extending through the bottom substrate and the top substrate includes a top signal via extending through the top substrate. The perimeter wall extends between a periphery of the top substrate and a periphery of the bottom substrate to form a cavity. The bottom electronic component is mounted on the bottom substrate, exposed to the cavity, and electrically coupled to the bottom signal via. The top electronic component is mounted on the top substrate, exposed to the cavity, and electrically coupled to the top signal via.

13 Claims, 5 Drawing Sheets

Related U.S. Application Data

Figure 1:
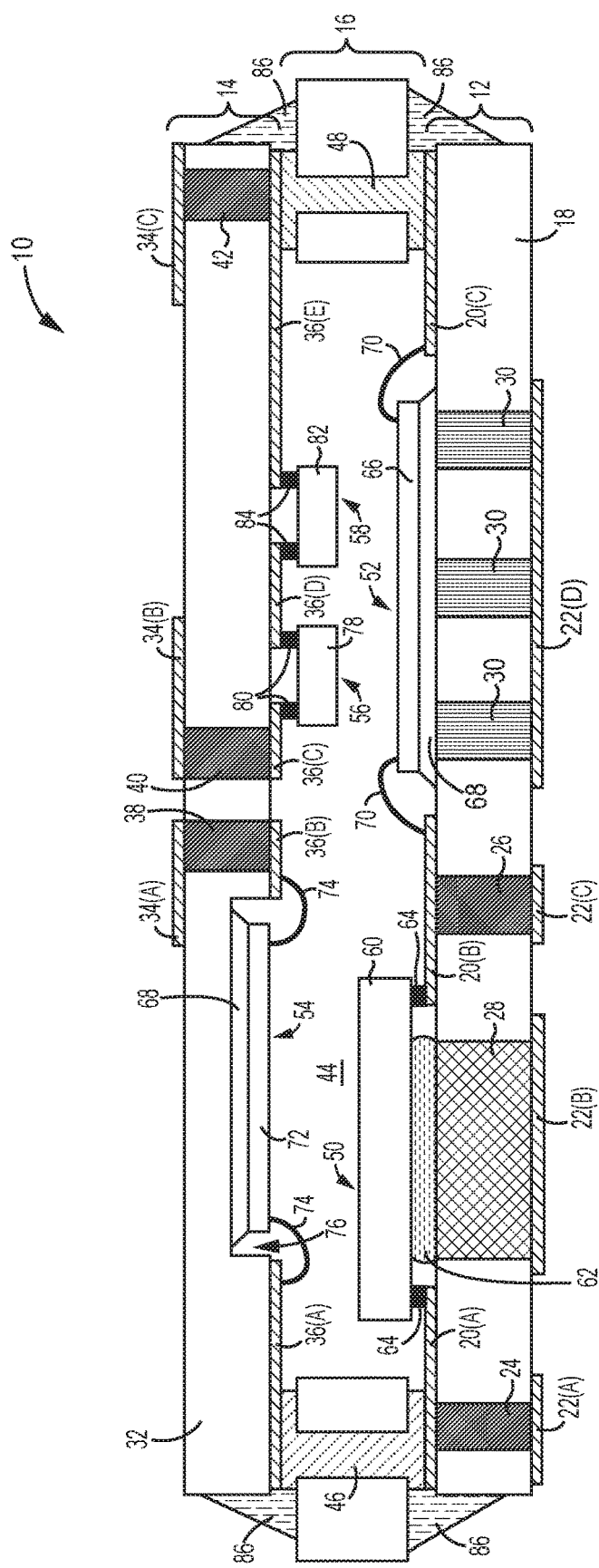

(60) Provisional application No. 62/381,756, filed on Aug. 31, 2016.

(51) Int. Cl.

| | | |
|---|---|---|
| *H01L 23/04* | (2006.01) | |
| *H01L 23/367* | (2006.01) | |
| *H01L 23/498* | (2006.01) | |
| *H01L 23/66* | (2006.01) | |
| *H01L 23/00* | (2006.01) | |
| *H01L 25/065* | (2006.01) | |
| *H01L 25/00* | (2006.01) | |
| *H01L 25/10* | (2006.01) | |
| *H01L 21/56* | (2006.01) | |

(52) U.S. Cl.
CPC .............. *H01L 24/16* (2013.01); *H01L 24/32* (2013.01); *H01L 24/73* (2013.01); *H01L 25/0655* (2013.01); *H01L 25/0657* (2013.01); *H01L 2223/6616* (2013.01); *H01L 2223/6677* (2013.01); *H01L 2224/16113* (2013.01); *H01L 2224/16168* (2013.01); *H01L 2224/16227* (2013.01); *H01L 2224/32225* (2013.01); *H01L 2224/32245* (2013.01); *H01L 2224/48091* (2013.01); *H01L 2224/48106* (2013.01); *H01L 2224/48227* (2013.01); *H01L 2224/73203* (2013.01); *H01L 2224/73265* (2013.01); *H01L 2225/0651* (2013.01); *H01L 2225/06517* (2013.01); *H01L 2225/06541* (2013.01); *H01L 2225/06589* (2013.01); *H01L 2225/107* (2013.01); *H01L 2225/1023* (2013.01); *H01L 2225/1088* (2013.01); *H01L 2225/1094* (2013.01); *H01L 2924/15153* (2013.01); *H01L 2924/15192* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | |
|---|---|---|
| 8,451,618 B2 | 5/2013 | Boeck et al. |
| 8,742,569 B2 | 6/2014 | Lo et al. |
| 8,803,302 B2 | 8/2014 | Viswanathan et al. |
| 8,841,171 B2 | 9/2014 | Lin et al. |
| 8,853,564 B2 | 10/2014 | Lo et al. |
| 8,907,467 B2 | 12/2014 | Komposch et al. |
| 9,935,026 B2 | 4/2018 | Anderson et al. |
| 9,974,158 B2 | 5/2018 | Railkar et al. |
| 2018/0061725 A1 | 3/2018 | Meliane et al. |

OTHER PUBLICATIONS

Author Unknown, "Package on Package (PoP | PSfvBGA | PSfcCSP | TMV® PoP)," Amkor Technology, date accessed: Aug. 17, 2016, 5 pages, http://www.amkor.com/go/Package-on-Package.

Author Unknown, "Microcircuits: SD-18 Part Requirement & Application Guide," Naval Sea Systems Command, Warfare Centers, NSWC Crane Division, no date, accessed Aug. 17, 2016, http://www.navsea.navy.mil/Home/Warfare-Centers/NSWC-Crane/Resources/SD-18/Products/Microcircuits/Packaging.aspx, 9 pages.

Chin, Spencer, "Flexible BGA hurdles cost barrier," Electronic Products, Dec. 1, 1997, 4 pages, http://www.electronicproducts.com/Passive_Components/Flexible_BGA_hurdles_cost_barrier.aspx.

Author Unknown, "IC Packaging—Part I," National Museum of American History, Series 9, Integrated Circuit Engineering Collection, ICECAP Reports, Feb. 10, 1982, 11 pages, http://smithsonianchips.si.edu/ice/package.htm.

Schueller, R. D. et al., "Performance and Reliability of a Cavity Down Tape BGA Package," 1997 IEEE/CPMT Electronic Packaging Technology Conference, 1997, IEEE, pp. 151-162.

Non-Final Office Action for U.S. Appl. No. 15/410,081, dated Jun. 29, 2017, 5 pages.

Final Office Action for U.S. Appl. No. 15/410,081, dated Oct. 31, 2017, 7 pages.

Non-Final Office Action for U.S. Appl. No. 15/410,151, dated Oct. 20, 2017, 6 pages.

Notice of Allowance for U.S. Appl. No. 15/410,151, dated Nov. 20, 2017, 7 pages.

Non-Final Office Action for U.S. Appl. No. 15/409,885, dated Nov. 13, 2017, 6 pages.

Notice of Allowance for U.S. Appl. No. 15/409,885, dated Feb. 15, 2018, 7 pages.

Notice of Allowance for U.S. Appl. No. 15/935,754, dated Oct. 10, 2018, 7 pages.

\* cited by examiner

AIR-CAVITY PACKAGE WITH DUAL SIGNAL-TRANSITION SIDES

RELATED APPLICATIONS

This application is a divisional of U.S. patent application Ser. No. 15/410,151, filed on Jan. 19, 2017, now U.S. Pat. No. 9,935,026, which claims the benefit of provisional patent application Ser. No. 62/381,756, filed on Aug. 31, 2016, the disclosures of which are hereby incorporated herein by reference in their entirety.

FIELD OF THE DISCLOSURE

The present disclosure relates to an air-cavity package and a process for making the same, and more particularly to an air-cavity package with dual signal-transition sides and a process to form the air-cavity package to provide dual signal-transition sides.

BACKGROUND

In semiconductor packaging, mold compounds are normally used to encapsulate flip-chip dies and or wire-bonding dies to protect the dies against damage from the outside environment. However, direct contact of the mold compounds and active die surfaces may adversely impact the electrical performance of the dies, especially for high frequency devices. Accordingly, it is desirable to package the dies in a configuration that is more appropriate for high frequency performance.

With developed semiconductor fabrication technology and popularity of portable communication electronic devices, such as cellular phones, tablet computers, and so forth, high levels of integration of semiconductor packages are highly desired. Package on package (POP), which stacks two or more semiconductor packages vertically, is a semiconductor packaging technology that allows higher electronics density in final products. POP offers benefits to small printed-circuit-board areas, where short trace lengths between different semiconductor packages helps enhance device performance. However, for applications that have space constraints in the z-direction (thickness), POP may not provide an optimal package solution.

Accordingly, there remains a need for improved package designs to increase the integration level of semiconductor packages and enhance the high frequency performance of the semiconductor packages without significantly increasing the package size.

SUMMARY

The present disclosure relates to an air-cavity package with dual signal-transition sides and a process for making the same. According to one embodiment, an air-cavity package includes a bottom substrate, a top substrate, a perimeter wall, a bottom electronic component, and a top electronic component. The bottom substrate includes a bottom substrate body having an upper side and a lower side, at least one first bottom metal structure on the upper side of the bottom substrate body, at least one second bottom metal structure on the lower side of the bottom substrate body, and at least one bottom signal via that extends from the upper side of the bottom substrate body through the bottom substrate body to the lower side of the bottom substrate body and is electrically coupled to the at least one second bottom metal structure. The top substrate includes a top substrate body having an upper side and a lower side, at least one first top metal structure on the upper side of the top substrate body, at least one second top metal structure on the lower side of the top substrate body, and at least one top signal via that extends from the upper side of the top substrate body through the top substrate body to the lower side of the top substrate body and is electrically coupled to the at least one first top metal structure. The perimeter wall extends from a periphery of the lower side of the top substrate body to a periphery of the upper side of the bottom substrate body. As such, a cavity is defined by a portion of the upper side of the bottom substrate body, an inside surface of the perimeter wall, and a portion of the lower side of the top substrate body. The perimeter wall includes at least one signal via structure that extends from an upper surface of the perimeter wall through the perimeter wall to a lower surface of the perimeter wall, and is electrically coupled to the at least one first bottom metal structure and the at least one second top metal structure. The bottom electronic component is mounted on the upper side of the bottom substrate body, exposed to the cavity, and electrically coupled to the at least one bottom signal via. The top electronic component is mounted on the lower side of the top substrate body, exposed to the cavity, and electrically coupled to the at least one top signal via.

In one embodiment of the air-cavity package, the bottom substrate further includes at least one bottom thermally conductive structure that extends from the upper side of the bottom substrate body through the bottom substrate body to the lower side of the bottom substrate body. The at least one bottom thermally conductive structure is thermally coupled to the bottom electronic component and conducts heat generated from the bottom electronic component toward the lower side of the bottom substrate body.

According to another embodiment, the air-cavity package is included in a system assembly. Besides the air-cavity package, the system assembly also includes a printed circuit board (PCB) and a patch antenna board. Herein, the lower side of the bottom substrate body is over the PCB such that the at least one bottom signal via transmits signals between the bottom electronic component and the PCB. The patch antenna board resides over the upper side of the upper substrate body such that the at least one top signal via transmits signals between the top electronic component and the patch antenna board.

In one embodiment of the system assembly, the PCB includes a heat sink extending through the PCB such that the at least one bottom thermally conductive structure is thermally coupled to the heat sink and conducts heat generated from the bottom electronic component to the heat sink.

According to an exemplary process for making an air-cavity package, a bottom package precursor including a bottom substrate and a bottom electronic component is provided. The bottom substrate includes a bottom substrate body having an upper side and a lower side, at least one first bottom metal structure on the upper side of the bottom substrate body, at least one second bottom metal structure on the lower side of the bottom substrate body, and at least one bottom signal via that extends from the upper side of the bottom substrate body through the bottom substrate body to the lower side of the bottom substrate body and is electrically coupled to the at least one second bottom metal structure. The bottom electronic component is mounted on the upper side of the bottom substrate body and electrically coupled to the at least one bottom signal via. Next, a top package precursor including a top substrate and a top electronic component is provided. The top substrate includes a top substrate body having an upper side and a lower side, at least one first top metal structure on the upper side of the top substrate body, at least one second top metal structure on the lower side of the top substrate body, and at least one top signal via that extends from the upper side of the top substrate body through the top substrate body to the lower side of the top substrate body and is electrically coupled to the at least one first top metal structure. The top electronic component is mounted on the lower side of the top substrate body and electrically coupled to the at least one top signal via. In addition, a perimeter wall including at least one signal via structure that extends from an upper surface of the perimeter wall through the perimeter wall to a lower surface of the perimeter wall is then provided. Finally, the bottom package precursor, the perimeter wall, and the top package precursor are assembled together. Herein, the perimeter wall extends from a periphery of the lower side of the top substrate body to a periphery of the upper side of the bottom substrate body such that a cavity is defined by a portion of the upper side of the bottom substrate body, an inside surface of the perimeter wall, and a portion of the lower side of the top substrate body. The bottom electronic component and the top electronic component are exposed to the cavity. The at least one signal via structure is electrically coupled to the at least one first bottom metal structure and the at least one second top metal structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides an exemplary air-cavity package according to one embodiment of the present disclosure.

Figure 2:
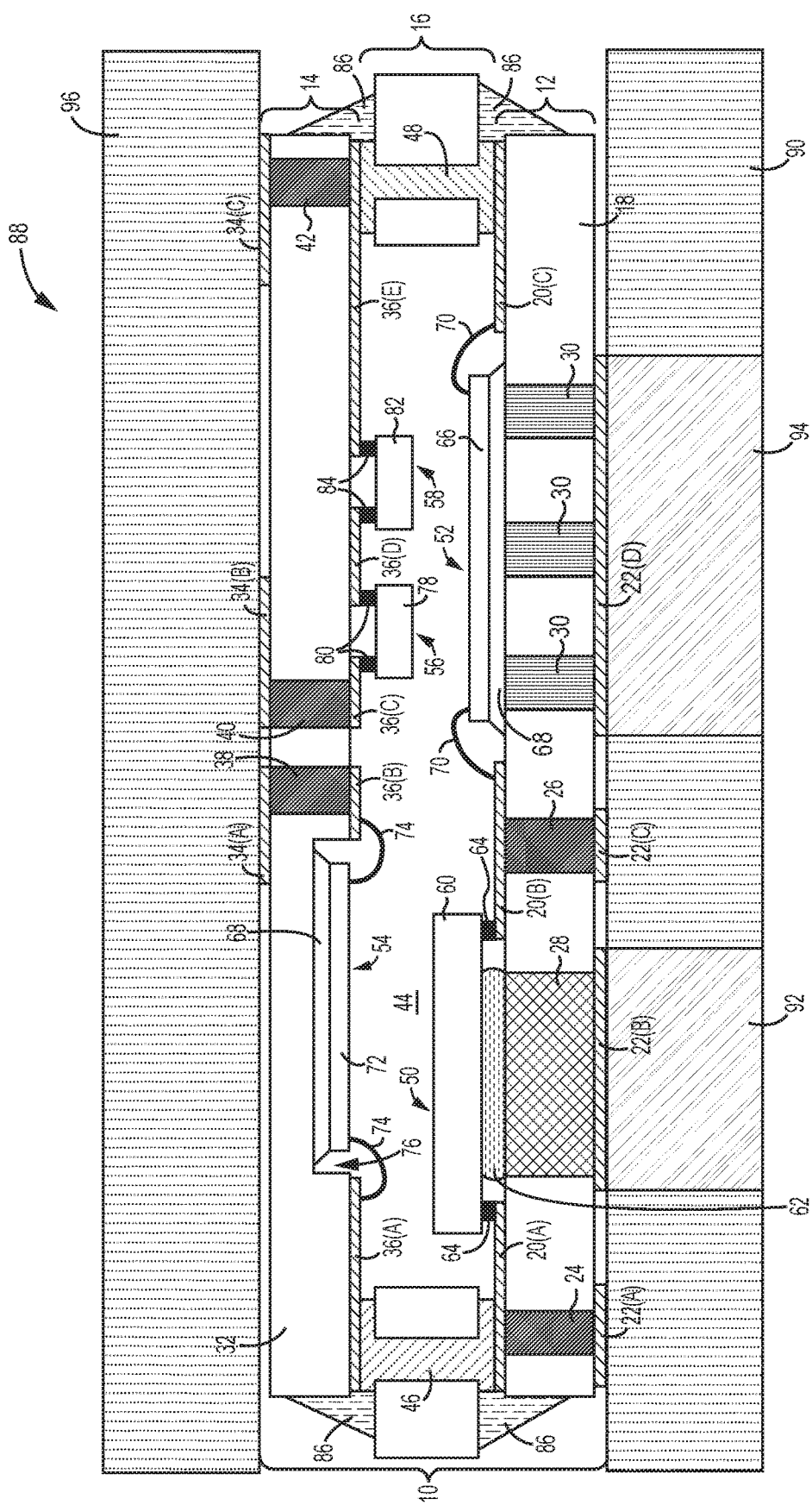

FIG. 2 provides an exemplary system assembly including the exemplary air-cavity package shown in FIG. 1.

Figure 3A:
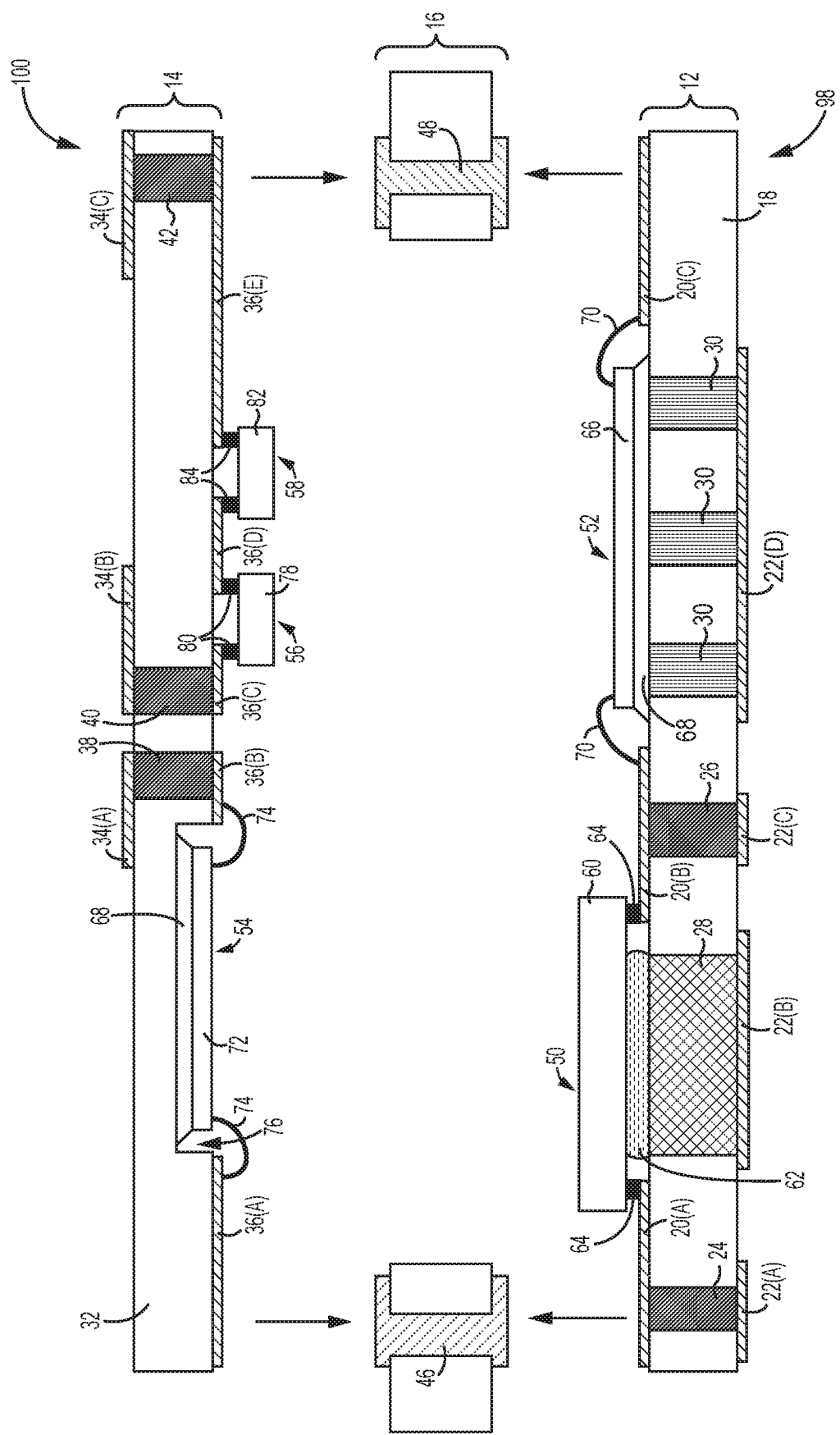
Figure 3B:
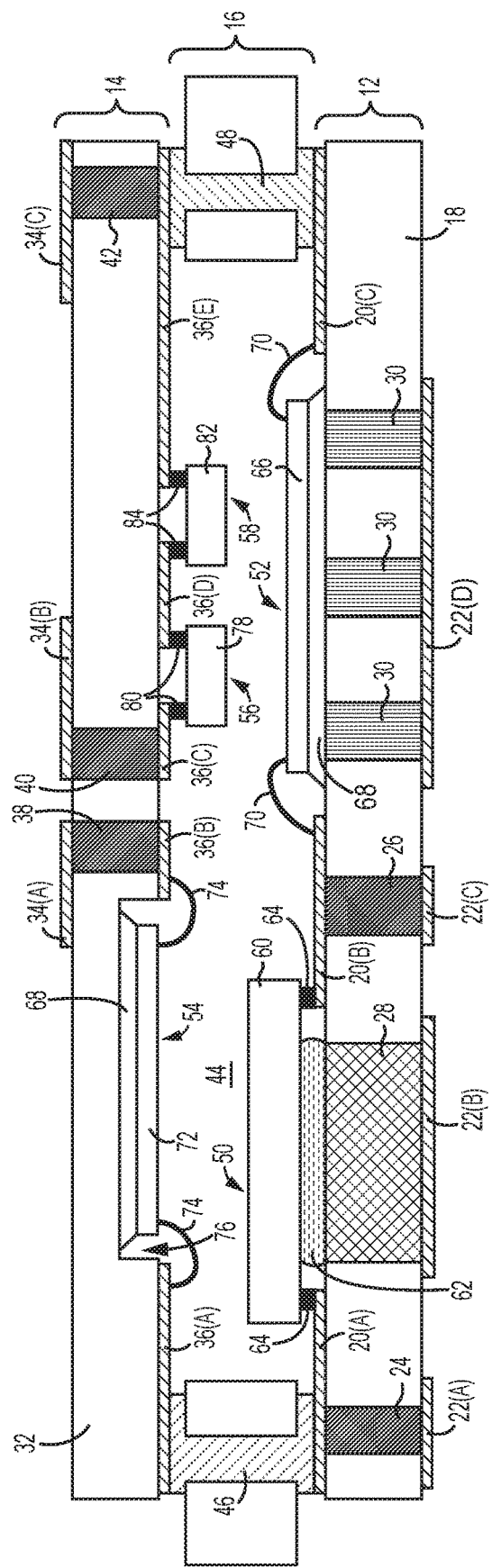
Figure 3C:
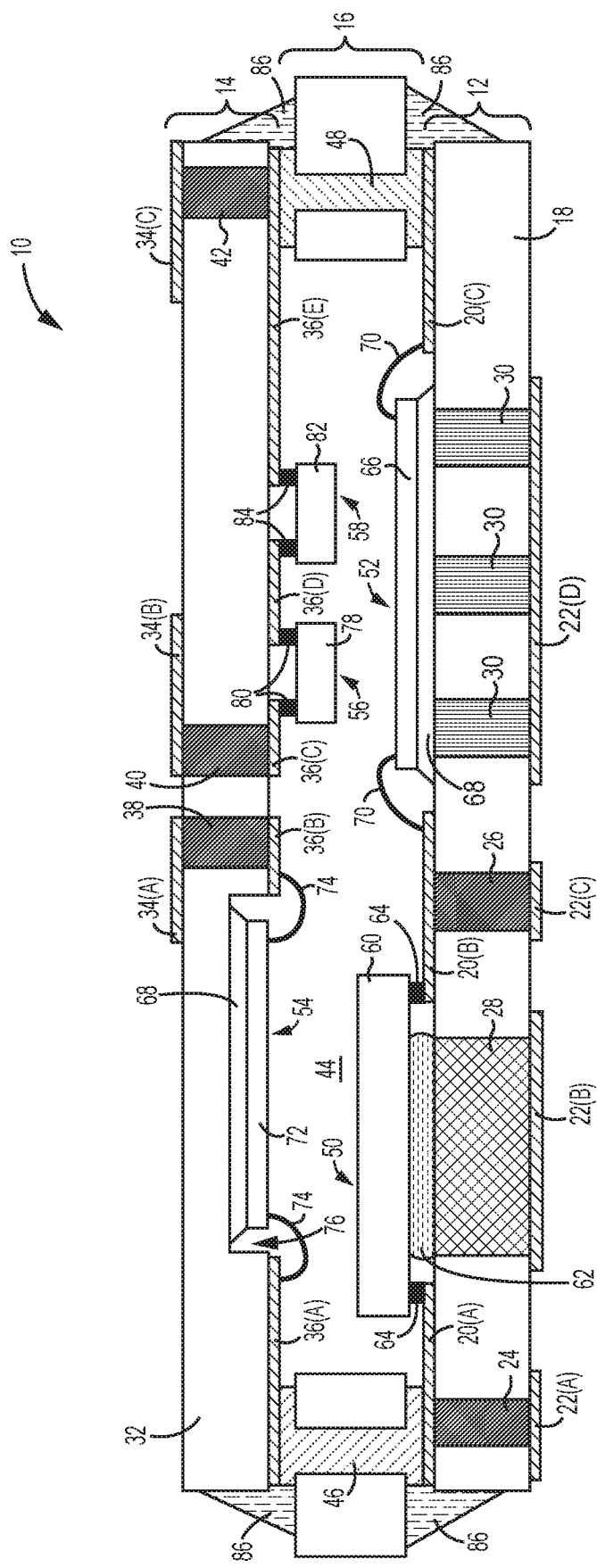

FIGS. 3A-3C illustrate an exemplary process to form the exemplary air-cavity package shown in FIG. 1 according to one embodiment of the present disclosure.

It will be understood that for clear illustrations, FIGS. 1-3C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 provides an exemplary air-cavity package 10 according to one embodiment of the present disclosure. In this embodiment, the air-cavity package 10 includes a bottom substrate 12, a top substrate 14, and a perimeter wall 16. In detail, the bottom substrate 12 is a multi-layer substrate (not shown) and includes a bottom substrate body 18 having an upper side and a lower side, a first bottom metal layer 20 on the upper side of the bottom substrate body 18, a second bottom metal layer 22 on the lower side of the bottom substrate body 18, a first bottom signal via 24, a second bottom signal via 26, a bottom slug 28, and a number of bottom thermal vias 30. For the purpose of this illustration, the first bottom metal layer 20 includes three separate metal structures: a first metal structure 20(A), a second metal structure 20(B), and a third metal structure 20(C). These metal structures 20(A)-20(C) of the first bottom metal layer 20 may be formed as metal pads and/or traces. The second bottom metal layer 22 includes four separate metal structures: a first metal structure 22(A), a second metal structure 22(B), a third metal structure 22(C), and a fourth metal structure 22(D). These metal structures 22(A)-22(D) of the second bottom metal layer 22 may be formed as metal pads and/or traces. In different applications, the first bottom metal layer 20 and the second bottom metal layer 22 may include fewer or more metal structures.

The first bottom signal via 24 extends from the upper side of the bottom substrate body 18 through the bottom substrate body 18 to the lower side of the bottom substrate body 18 and is electrically coupled to the first metal structure 20(A) of the first bottom metal layer 20 and the first metal structure 22(A) of the second bottom metal layer 22. The second bottom signal via 26 extends from the upper side of the bottom substrate body 18 through the bottom substrate body 18 to the lower side of the bottom substrate body 18 and is electrically coupled to the second metal structure 20(B) of the first bottom metal layer 20 and the third metal structure 22(C) of the second bottom metal layer 22. In different applications, there may be fewer or more bottom signal vias included in the bottom substrate 12.

Further, the bottom slug 28 and the bottom thermal vias 30 are thermally conductive structures. The bottom slug 28 may be formed from copper and have at least 100 W/m·k thermal conductivity. Herein, the bottom slug 28 extends from the upper side of the bottom substrate body 18 through the bottom substrate body 18 to the lower side of the bottom substrate body 18, and is thermally coupled to the second metal structure 22(B) of the second bottom metal layer 22. The bottom thermal vias 30 may be filled with epoxy or plated by copper. The bottom thermal vias 30 extend from the upper side of the bottom substrate body 18 through the bottom substrate body 18 to the lower side of the bottom substrate body 18, and are thermally coupled to the fourth metal structure 22(D) of the second bottom metal layer 22. In different applications, there may be fewer or more bottom slugs/bottom thermal vias included in the bottom substrate 12.

The top substrate 14 is a multi-layer substrate (not shown) and includes a top substrate body 32 having an upper side and a lower side, a first top metal layer 34 on the upper side of the top substrate body 32, a second top metal layer 36 on the lower side of the top substrate body 32, a first top signal via 38, a second top signal via 40, and a third top signal via 42. For the purpose of this illustration, the first top metal layer 34 includes three separate metal structures: a first metal structure 34(A), a second metal structure 34(B), and a third metal structure 34(C). These metal structures 34(A)-34(C) of the first top metal layer 34 may be formed as metal pads and/or traces. The second top metal layer 36 includes five separate metal structures: a first metal structure 36(A), a second metal structure 36(B), a third metal structure 36(C), a fourth metal structure 36(D), and a fifth metal structure 36(E). These metal structures 36(A)-36(E) of the second top metal layer 36 may be formed as metal pads and/or traces. In different applications, the second top metal layer 36 may include fewer or more metal structures.

The first top signal via 38 extends from the upper side of the top substrate body 32 through the top substrate body 32 to the lower side of the top substrate body 32 and is electrically coupled to the first metal structure 34(A) of the first top metal layer 34 and the second metal structure 36(B) of the second top metal layer 36. The second top signal via 40 extends from the upper side of the top substrate body 32 through the top substrate body 32 to the lower side of the top substrate body 32 and is electrically coupled to the second metal structure 34(B) of the first top metal layer 34 and the third metal structure 36(C) of the second top metal layer 36. The third top signal via 42 extends from the upper side of the top substrate body 32 through the top substrate body 32 to the lower side of the top substrate body 32 and is electrically coupled to the third metal structure 34(C) of the first top metal layer 34 and the fifth metal structure 36(E) of the second top metal layer 36. In different applications, there may be fewer or more bottom signal vias included in the top substrate 14.

The perimeter wall 16 extends from a periphery of the lower side of the top substrate body 32 to a periphery of the upper side of the bottom substrate body 18. As such, a cavity 44 is defined by a portion of the upper side of the bottom substrate body 18, an inside surface of the perimeter wall 16, and a portion of the lower side of the top substrate body 32. The perimeter wall 16 includes two separate via structures: a first signal via structure 46 and a second signal via structure 48. The first signal via structure 46 extends from an upper surface of the perimeter wall 16 through the perimeter wall 16 to a lower surface of the perimeter wall 16, and is electrically coupled to the first metal structure 20(A) of the first bottom metal layer 20 and the first metal structure 36(A) of the second top metal layer 36. The second signal via structure 48 extends from the upper surface of the perimeter wall 16 through the perimeter wall 16 to the lower surface of the perimeter wall 16, and is electrically coupled to the third metal structure 20(C) of the first bottom metal layer 20 and the fifth metal structure 36(E) of the second top metal layer 36.

In addition, the air-cavity package 10 also includes a number of electronic components mounted on the bottom substrate 12 and the top substrate 14. For the purpose of this illustration, the air-cavity package 10 includes a bottom surface mounted device (SMD) 50 and a bottom wire-bonding die 52 mounted on the upper side of the bottom substrate body 18, and a top wire-bonding die 54, a first top SMD 56, and a second top SMD 58 mounted on the lower side of the top substrate body 32. The bottom SMD 50, the bottom wire-bonding die 52, the top wire-bonding die 54, the first top SMD 56, and the second top SMD 58 are exposed to the cavity 44. In different applications, the air-cavity package 10 may include fewer or more wire-bonding dies and SMDs.

The bottom SMD 50 includes a bottom SMD body 60 mounted on the upper side of the bottom substrate body 18 via a SMD-attach material 62, and two bottom SMD interconnects 64. The bottom SMD interconnects 64 extend outward from a bottom surface of the bottom SMD body 60, and are coupled to the first metal structure 20(A) and the second metal structure 20(B) of the first bottom metal layer 20. In different applications, the bottom SMD 50 may include more bottom SMD interconnects. Herein, the first bottom signal via 24 and the second bottom signal via 26 are electrically coupled to the bottom SMD 50, and the bottom slug 28 is thermally coupled to the bottom SMD 50. The bottom SMD 50 may be a resistor, capacitor, inductor, or flip-chip die.

The bottom wire-bonding die 52 includes a bottom wire-bonding die body 66 mounted on the upper side of the bottom substrate body 18 via a die-attach material 68, and two bottom bonding wires 70. The bottom bonding wires 70 extend from a top surface of the bottom wire-bonding die body 52, and are electrically coupled to the second metal structure 20(B) and the third metal structure 20(C) of the first bottom metal layer 20. In different applications, the bottom wire-bonding die 52 may include more bottom bonding wires. Herein, the bottom signal via 26 is electrically coupled to the bottom wire-bonding die 52 and the bottom thermal vias 30 are thermally coupled to the bottom wire-bonding die 52.

The top wire-bonding die 54 includes a top wire-bonding die body 72 mounted on the lower side of the bottom substrate body 32 via the die-attach material 68, and two top bonding wires 74. The top bonding wires 74 extend from a top surface of the top wire-bonding die body 72 and are electrically coupled to the first metal structure 36(A) and the second metal structure 36(B) of the second top metal layer 36. In different applications, the top wire-bonding die 54 may include more top bonding wires. In this embodiment, the lower side of the top substrate body 32 may not have a flat surface and may have a recess 76, in which the top wire-bonding die 54 is mounted. Herein, the first top signal via 38 is electrically coupled to the top wire-bonding die 54.

The first top SMD 56 includes a first top SMD body 78 and two first top SMD interconnects 80. The first top SMD interconnects 80 extend outward from a bottom surface of the first top SMD body 78, and are coupled to the third metal structure 36(C) and the fourth metal structure 36(D) of the second top metal layer 36. In different applications, the first top SMD 56 may include more first top SMD interconnects. Herein, the second top signal via 40 is electrically coupled to the first top SMD 56. The first top SMD 56 may be a resistor, capacitor, inductor, or flip-chip die.

The second top SMD 58 includes a second top SMD body 82 and two second top SMD interconnects 84. The second top SMD interconnects 84 extend outward from a bottom surface of the second top SMD body 82, and are coupled to the fourth metal structure 36(D) and the fifth metal structure 36(E) of the second top metal layer 36. In different applications, the second top SMD 58 may include more second top SMD interconnects. Herein, the third top signal via 42 is electrically coupled to the second top SMD 58. The second top SMD 58 may be a resistor, capacitor, inductor, or flip-chip die.

The air-cavity package 10 may also include a sealing material 86 used to seal off the cavity 44. The sealing material 86 extends about an exterior portion of a top junction, which is formed between the upper surface of the perimeter wall 16 and the lower side of the top substrate body 32, and an exterior portion of a bottom junction, which is formed between the lower surface of the perimeter wall 16 and the upper side of the bottom substrate body 18.

FIG. 2 provides an exemplary system assembly 88 including the air-cavity package 10 shown in FIG. 1. Besides the air-cavity package 10, the system assembly 88 also includes a printed circuit board (PCB) 90 with a first heat sink 92 and a second heat sink 94 extending through the PCB 90, and a patch antenna board 96. The lower side of the bottom substrate body 18 is over the PCB 90, such that the first bottom signal via 24 and the second bottom signal via 26 are electrically coupled to the PCB 90 by the first metal structure 22(A) and the third metal structure 22(C) of the second bottom metal layer 22, respectively. The bottom slug 28 is thermally coupled to the first heat sink 92 of the PCB 90 by the second metal structure 22(B) of the second bottom metal layer 22. The bottom thermal vias 30 are thermally coupled to the second heat sink 94 of the PCB 90 by the fourth metal structure 22(D) of the second bottom metal layer 22. In addition, the patch antenna board 96 resides over the upper side of the top substrate body 32, such that the first top signal via 38, the second top signal via 40, and the third top signal via 42 are electrically coupled to the patch antenna board 96 by the first metal structure 34(A), the second metal structure 34(B), and the third metal structure 34(C) of the first top metal layer 34, respectively.

Notice that the air-cavity package 10 has dual signal-transition sides: the lower side of the bottom substrate body 18 and the upper side of the top substrate body 32. The dual signal-transition sides of the air-cavity package 10 may enhance the integration of the air-cavity package 10. The first bottom signal via 24 and the second bottom signal via 26 may be used for signal transitions between the electronic components mounted on the upper side of the bottom substrate body 18 (like the bottom SMD 50 and the bottom wire-bonding die 52) and the PCB 90. The first top signal via 38, the second top signal via 40, and the third top signal via 42 may be used for signal transitions between the electronic components mounted on the lower side of the top substrate body 32 (like the top wire-bonding die 54, the first top SMD 56, and the second top SMD 58) and the patch antenna board 96.

In addition, the first signal via structure 46 and the second signal via structure 48 may be used for signal transitions between the electronic components mounted on the upper side of the bottom substrate body 18 (like the bottom SMD 50 and the bottom wire-bonding die 52) and the electronic components mounted on the lower side of the top substrate body 32 (the top wire-bonding die 54, the first top SMD 56, and the second top SMD 58). Herein, the first signal via structure 46 may be electrically isolated from the second signal via structure 48. Signals generated by the electronic components mounted on the upper side of the bottom substrate body 18 (like the bottom SMD 50 and the bottom wire-bonding die 52) may also be transited to the patch antenna board 96 by the second signal via structure 48 and the third top signal via 42. Signals generated by the electronic components mounted on the lower side of the top substrate body 32 (like the top wire-bonding die 54, the first top SMD 56, and the second top SMD 58) may be transited to the PCB 90 by the first signal via structure 46 and the first bottom signal via 24.

Further, the heat generated from the electronic components mounted on the upper side of the bottom substrate body 18 (like the bottom SMD 50 and the bottom wire-bonding die 52) may be conducted toward the first and second heat sinks 92 and 94 of the PCB 90 through the bottom thermally conductive structures (like the bottom slug 28 and the bottom thermal vias 30). Herein, each bottom thermally conductive structure (like the bottom slug 28 and the bottom thermal vias 30) is directly in a heat dissipation path and adjacent to an electric component (like the bottom SMD 50 and the bottom wire-bonding die 52). Each signal via (like the first bottom signal via 24, the second bottom signal via 26, the first top signal via 38, the second top signal via 40, or the third top signal via 42) is not directly in a heat dissipation path.

FIGS. 3A-3C illustrate an exemplary process to form the exemplary air-cavity package 10 shown in FIG. 1. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 3A-3C.

Initially, a bottom package precursor 98, a top package precursor 100, and the perimeter wall 16 are provided as depicted in FIG. 3A. The bottom package precursor 98 includes the bottom substrate 12, the bottom SMD 50, and the bottom wire-bonding die 52. The configurations of the bottom substrate 12, the bottom SMD 50, and the bottom wire-bonding die 52 are the same as described above. As such, the bottom SMD body 60 of the bottom SMD 50 is mounted on the upper side of the bottom substrate body 18 via the SMD-attach material 62. The bottom SMD interconnects 64 of the bottom SMD 50 are coupled to the first metal structure 20(A) and the second metal structure 20(B) of the bottom substrate 12. Herein, the first bottom signal via 24 and the second bottom signal via 26 are electrically coupled to the bottom SMD 50. The bottom slug 28 is thermally coupled to the bottom SMD 50 and will conduct heat generated from the bottom SMD 50 toward the lower side of the bottom substrate body 18. The bottom wire-bonding die body 66 of the bottom wire-bonding die 52 is mounted on the upper side of the bottom substrate body 18 via the die-attach material 68. The bottom bonding wires 70 of the bottom wire-bonding die 52 are electrically coupled to the second metal structure 20(B) and the third metal structure 20(C) of the bottom substrate 12. Herein, the second bottom signal via 26 is electrically coupled to the bottom wire-bonding die 52. The bottom thermal vias 30 are thermally coupled to the bottom wire-bonding die 52 and will conduct heat generated from the bottom wire-bonding die 52 toward the lower side of the bottom substrate body 18.

In addition, the top package precursor 100 includes the top substrate 14, the top wire-bonding die 54, the first top SMD 56, and the second top SMD 58. The configurations of the top substrate 14, the top wire-bonding die 54, the first top SMD 56, and the second top SMD 58 are the same as described above. As such, the top wire-bonding die body 72 of the top wire-bonding die 54 is mounted on the lower side of the top substrate body 32 via the die-attach material 68. The top bonding wires 74 of the top wire-bonding die 54 are electrically coupled to the first metal structure 36(A) and the second metal structure 36(B) of the top substrate 14. Herein, the first top signal via 38 is electrically coupled to the top wire-bonding die 54. The first top SMD 56 and the second top SMD 58 are mounted on the lower side of the top substrate body 32. The first top SMD interconnects 80 of the first top SMD 56 are coupled to the third metal structure 36(C) and the fourth metal structure 36(D) of the top substrate 14. The second top SMD interconnects 84 of the second top SMD 58 are coupled to the fourth metal structure 36(D) and the fifth metal structure 36(E) of the top substrate 14. Herein, the second top signal via 40 is electrically coupled to the first top SMD 56 and the third top signal via 42 is electrically coupled to the second top SMD 58.

Next, the bottom package precursor 98, the top package precursor 100, and the perimeter wall 16 are assembled together as depicted in FIG. 3B. The perimeter wall 16 extends from the periphery of the lower side of the top substrate body 32 to the periphery of the upper side of the bottom substrate body 18 such that the cavity 44 is defined by a portion of the upper side of the bottom substrate body 18, the inside surface of the perimeter wall 16, and a portion of the lower side of the top substrate body 32. The bottom SMD 50, the bottom wire-bonding die 52, the top wire-bonding die 54, the first top SMD 56, and the second top SMD 58 are exposed to the cavity 44. The first signal via structure 46 of the perimeter wall 16 is electrically coupled to the first metal structure 20(A) of the bottom substrate 12 and the first metal structure 36(A) of the top substrate 14. The second signal via structure 48 of the perimeter wall 16 is electrically coupled to the third metal structure 20(C) of the bottom substrate 12 and the fifth metal structure 36(E) of the top substrate 14.

Finally, the sealing material 86 is applied to an exterior portion of the top junction, which is formed between the upper surface of the perimeter wall 16 and the lower side of the top substrate body 32, and an exterior portion of the bottom junction, which is formed between the lower surface of the perimeter wall 16 and the upper side of the bottom substrate body 18 as depicted in FIG. 3C. The cavity 44 is sealed off by the sealing material 86, and the air-cavity package 10 is formed.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    providing a bottom package precursor, which comprises a bottom substrate and a bottom electronic component, wherein:
        the bottom substrate comprises a bottom substrate body having an upper side and a lower side, at least one first bottom metal structure on the upper side of the bottom substrate body, at least one second bottom metal structure on the lower side of the bottom substrate body, and at least one bottom signal via that extends from the upper side of the bottom substrate body through the bottom substrate body to the lower side of the bottom substrate body and is electrically coupled to the at least one second bottom metal structure; and
        the bottom electronic component is mounted on the upper side of the bottom substrate body and electrically coupled to the at least one bottom signal via;
    providing a top package precursor, which comprises a top substrate and a top electronic component, wherein:
        the top substrate comprises a top substrate body having an upper side and a lower side, at least one first top metal structure on the upper side of the top substrate body, at least one second top metal structure on the lower side of the top substrate body, and at least one top signal via that extends from the upper side of the top substrate body through the top substrate body to the lower side of the top substrate body and is electrically coupled to the at least one first top metal structure; and
        the top electronic component is mounted on the lower side of the top substrate body and electrically coupled to the at least one top signal via;
    providing a perimeter wall, which comprises at least one signal via structure extending from an upper surface of the perimeter wall through the perimeter wall to a lower surface of the perimeter wall; and
    assembling the bottom package precursor, the perimeter wall, and the top package precursor, wherein:
        the perimeter wall extends from a periphery of the lower side of the top substrate body to a periphery of the upper side of the bottom substrate body such that a cavity is defined by a portion of the upper side of the bottom substrate body, an inside surface of the perimeter wall, and a portion of the lower side of the top substrate body;
        the bottom electronic component and the top electronic component are exposed to the cavity; and the at least one signal via structure is electrically coupled to the at least one first bottom metal structure and the at least one second top metal structure.

2. The method of claim 1 further comprising applying a sealing material to an exterior portion of a top junction, which is formed between the upper surface of the perimeter wall and the lower side of the top substrate body, and an exterior portion of a bottom junction, which is formed between the lower surface of the perimeter wall and the upper side of the bottom substrate body.

3. The method of claim 1 wherein the bottom substrate further comprises at least one bottom thermally conductive structure that extends from the upper side of the bottom substrate body through the bottom substrate body to the lower side of the bottom substrate body, wherein the at least one bottom thermally conductive structure is thermally coupled to the bottom electronic component and conducts heat generated from the bottom electronic component toward the lower side of the bottom substrate body.

4. The method of claim 3 wherein the at least one bottom thermally conductive structure comprises a plurality of thermal vias.

5. The method of claim 3 wherein the at least one bottom thermally conductive structure comprises a slug.

6. The method of claim 1 wherein the at least one bottom signal via is electrically coupled to the at least one first bottom metal structure.

7. The method of claim 1 wherein the at least one top signal via is electrically coupled to the at least one second top metal structure.

8. The method of claim 1 wherein the bottom electronic component is one from a group consisting of a resistor, a capacitor, an inductor, and a flip-chip die.

9. The method of claim 1 wherein the bottom electronic component is a wire-bonding die.

10. The method of claim 1 wherein the top electronic component is one from a group consisting of a resistor, a capacitor, an inductor, and a flip-chip die.

11. The method of claim 1 wherein the top electronic component is a wire-bonding die.

12. The method of claim 1 wherein the bottom substrate is a multi-layer substrate.

13. The method of claim 1 wherein the top substrate is a multi-layer substrate.

* * * * *